(12) United States Patent
Yang et al.

(10) Patent No.: US 10,103,200 B2
(45) Date of Patent: *Oct. 16, 2018

(54) RESISTIVE SWITCHING RANDOM ACCESS MEMORY WITH ASYMMETRIC SOURCE AND DRAIN

(71) Applicant: Taiwan Semiconductor Manufacturing Company., Ltd., Hsin-Chu (TW)

(72) Inventors: Chin-Chieh Yang, New Taipei (TW); Hsia-Wei Chen, Taipei (TW); Chih-Yang Chang, Yualin Township, Changhua County (TW); Kuo-Chi Tu, Hsin-Chu (TW); Wen-Ting Chu, Kaohsiung (TW); Yu-Wen Liao, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 37 days.

This patent is subject to a terminal disclaimer.

(21) Appl. No.: 15/292,964

(22) Filed: Oct. 13, 2016

(65) Prior Publication Data
US 2017/0033159 A1   Feb. 2, 2017

Related U.S. Application Data

(63) Continuation of application No. 13/795,123, filed on Mar. 12, 2013, now Pat. No. 9,478,638.

(51) Int. Cl.
*H01L 27/24* (2006.01)
*H01L 29/66* (2006.01)
(Continued)

(52) U.S. Cl.
CPC ........ *H01L 27/2436* (2013.01); *H01L 21/266* (2013.01); *H01L 21/26513* (2013.01);
(Continued)

(58) Field of Classification Search
CPC ....................................................... H01L 27/24
See application file for complete search history.

(56) References Cited

U.S. PATENT DOCUMENTS 6,677,637 B2   1/2004   Bernstein et al.
6,737,728 B1   5/2004   Block et al.
(Continued)

OTHER PUBLICATIONS

H. S. Philip Wong et al., "Metal-Oxide RRAM," Proceedings of the IEEE, vol. 100, No. 6, Jun. 2012, pp. 1951-1970.

*Primary Examiner* — Marvin Payen
(74) *Attorney, Agent, or Firm* — Haynes and Boone, LLP

(57) ABSTRACT

A resistive random access memory (RRAM) structure includes a resistive memory element formed on a semiconductor substrate and designed for data storage. The resistive element includes a resistive material layer. The resistive element further includes first and second electrodes interposed by the resistive material layer. The resistive element further includes a field effect transistor (FET) formed on the semiconductor substrate and coupled with the resistive memory element, wherein the FET includes asymmetric source and drain, the drain having a higher doping concentration than the source. The resistive memory element is coupled with the drain.

20 Claims, 18 Drawing Sheets

(51) Int. Cl.
    *H01L 45/00*     (2006.01)
    *H01L 21/265*     (2006.01)
    *H01L 21/266*     (2006.01)
    *H01L 29/08*     (2006.01)
    *H01L 29/78*     (2006.01)

(52) U.S. Cl.
    CPC .... *H01L 29/0847* (2013.01); *H01L 29/66659* (2013.01); *H01L 29/7835* (2013.01); *H01L 45/04* (2013.01); *H01L 45/08* (2013.01); *H01L 45/1233* (2013.01); *H01L 45/145* (2013.01); *H01L 45/146* (2013.01); *H01L 45/16* (2013.01); *H01L 45/1625* (2013.01)

(56) References Cited

U.S. PATENT DOCUMENTS

| | | |
|---|---|---|
| 6,781,185 B2 | 8/2004 | Chen et al. |
| 6,803,641 B2 | 10/2004 | Papa Rao et al. |
| 6,849,891 B1 | 2/2005 | Hsu et al. |
| 6,936,881 B2 | 8/2005 | Yeo et al. |
| 6,937,457 B2 | 8/2005 | Shih et al. |
| 6,940,705 B2 | 9/2005 | Yeo et al. |
| 7,195,970 B2 | 3/2007 | Tu et al. |
| 7,407,858 B2 | 8/2008 | Li et al. |
| 7,557,399 B2 | 7/2009 | Tu et al. |
| 8,000,128 B2 | 8/2011 | Li et al. |
| 8,009,454 B2 | 8/2011 | Lee et al. |
| 9,478,638 B2 * | 10/2016 | Yang ................ H01L 29/66659 |
| 2010/0244147 A1 | 9/2010 | Yang et al. |
| 2012/0039111 A1 | 1/2012 | Jung et al. |
| 2012/0068148 A1 | 3/2012 | Kawashima et al. |

\* cited by examiner

RESISTIVE SWITCHING RANDOM ACCESS MEMORY WITH ASYMMETRIC SOURCE AND DRAIN

PRIORITY INFORMATION

This application is a continuation of U.S. patent application Ser. No. 13/795,123 filed Mar. 12, 2013 and entitled "Resistive Switching Random Access Memory with Asymmetric Source and Drain," the disclosure of which is hereby incorporated by reference in the entirety.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1."

In advanced technology nodes, the feature size scales down and the size of memory devices is reduced accordingly. However, the reduction of the RRAM devices is limited due to the "forming" operation. In the "forming" operation, a high voltage is applied to the RRAM device to generate a conductive path in the resistive material layer of the RRAM device. The high "forming" voltage introduces reliability concern. Particularly, when a core device is formed as a selector device, the forming voltage is higher than the core device operation voltage. The selector device suffers the junction damage during the forming operation. Other solutions could not overcome the issue without introducing other side effects. For example, when the transistor off-state resistance is tuned higher, the voltage drop on the selector device during the forming operation is high, causing the damage to the selector device. When the transistor off-state resistance is tuned lower, the selector device may not function properly or have a high leakage current.

Accordingly, it would be desirable to provide an improved RRAM structure and a method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
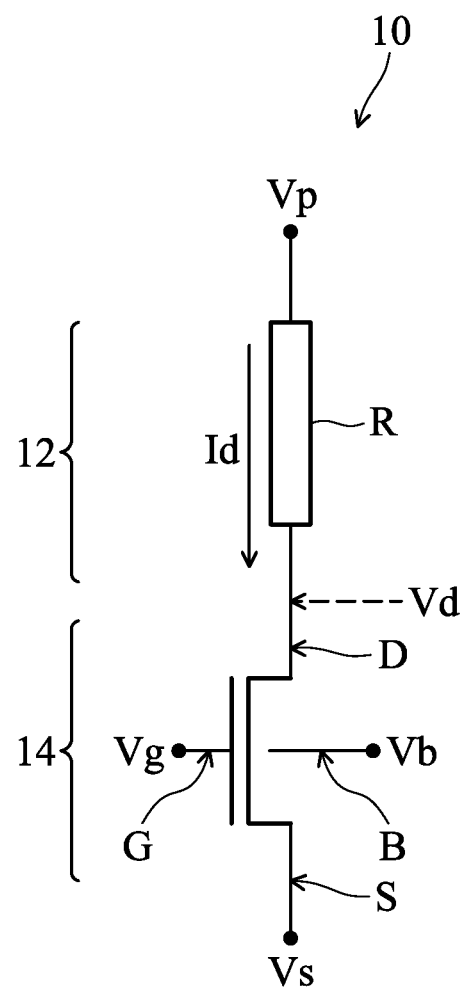
FIG. 1 is a schematic view of a resistive random access memory (RRAM) cell having a resistive memory element and a field effect transistor constructed according to aspects of the present disclosure in various embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a schematic view of resistive random access memory (RRAM) structure 10 constructed according to one embodiment. The RRAM structure 10 includes one resistive memory element 12 and a current-controlling device 14 connected together. The resistive memory element 12 includes a resistive material layer (or a dielectric material layer) interposed between two electrodes. In one embodiment, the resistance of the resistive material layer is operable to be adjusted into multiple levels that represent different logic states, respectively. In another embodiment, the resistive memory element 12 further includes a capping layer disposed between the resistive material layer and one of the electrodes.

The current-controlling device 14 in the RRAM structure 10 is a device that is operable to control the current flow through the resistive memory element 12 during the operations. In the present embodiment, the current-controlling device 14 is a transistor (or selector transistor), such as a field effect transistor (FET). For example, the FET 14 is a metal-oxide-semiconductor (MOS) FET. The FET 14 includes source, drain and gate. The source and drain are designed asymmetrically. In the present embodiment, the source and drain are designed asymmetrically such that a voltage drop over the FET during a forming operation and an off-state leakage current are collectively optimized. The source and drain are separately formed so that the source and drain are independently tuned to achieve the asymmetric structure. More particularly, the source and drain are different from each other in term of doping concentration. In various embodiments, the source and drain are different in at least one of doping concentration, doping profile and doping species.

The FET 14 is electrically coupled with the resistive memory element 12. In the present example, one electrode of the resistive memory element 12 is connected to the drain of the FET 14. In furtherance of the example, the gate of the FET 14 is connected to a word line and another electrode of the resistive memory element 12 is connected to a bit line.

As illustrated in FIG. 1, the gate, source, drain and body of the transistor 14 are labeled as G, S, D and B, respectively. The corresponding voltages of the gate, source, drain and substrate during the operations are labeled as Vg, Vs, Vd and Vb, respectively. Furthermore, during the operation, the current through the resistive memory element 12 is labeled as Id and the voltage applied to one electrode of the resistive memory element 12 from the bit line is labeled as Vp. The RRAM structure 10 has resistive memory element 12 and the FET 14 configured to form a RRAM cell.

In one embodiment, the RRAM structure 10 is a two terminal memory cell with the gate of the FET 14 as a first terminal and one electrode of the resistive memory element 12 as a second terminal. The first terminal is controlled by a first voltage applied to the gate from the word line and the second terminal is controlled by a second voltage applied to the one electrode of the resistive memory element from the bit line. In one example, the source is grounded, and the body of the FET is grounded or floating.

In another embodiment, the RRAM structure 10 is a three terminal memory cell, wherein the three terminals include the gate of FET 14 as a first terminal, the electrode of the resistive memory element 12 (the electrode that is not directly connected with the drain of the transistor) as a second terminal and the source of the FET 14 as a third terminal. Particularly, during the operations of the memory cell, the first terminal (gate) is controlled by a first voltage from the word line, the second terminal is controlled by a second voltage from the bit line, and the third terminal is controlled by a third voltage from a source line. In one example, the source is grounded. In an alternative example, the second terminal is grounded. The substrate (or the body) of the FET 14 may be grounded or floating.

Figure 2:
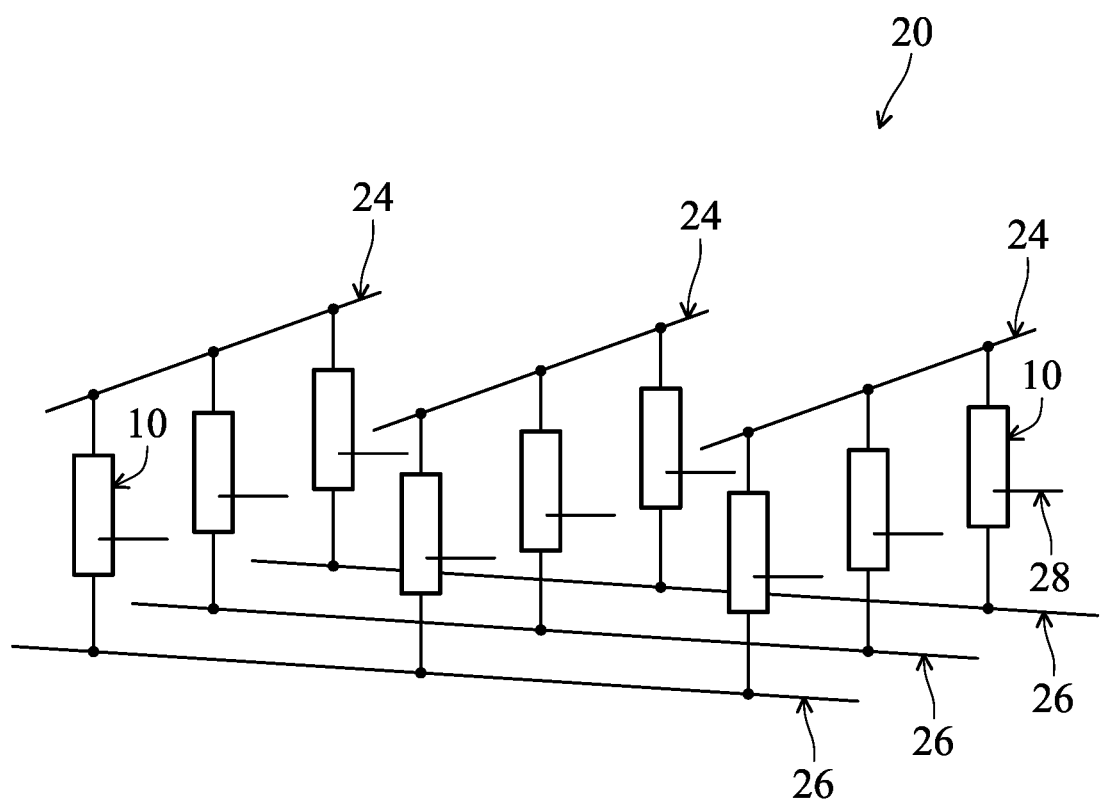
FIG. 2 is a memory structure having a plurality of memory cells constructed according to aspects of the present disclosure in one embodiment.

FIG. 2 is a schematic view of a memory structure 20 having a plurality of memory cells 10 constructed according to aspects of the present disclosure in one embodiment. The memory cells are configured in an array coupled with a plurality of word lines 24 and a plurality of bit lines 26. In one embodiment, the word lines 24 and the bit lines 26 are cross configured. Furthermore, each of the memory cells 10 may be operable to achieve multiple resistance levels and accordingly multiple bit storage. In the present embodiment, source lines 28 are configured to connect to the sources of the memory cells, respectively. The source lines 28 may be configured such that one source line couples to one memory cell, or alternatively one source line couples a subset of the memory cells in the memory structure 20.

Figure 3:
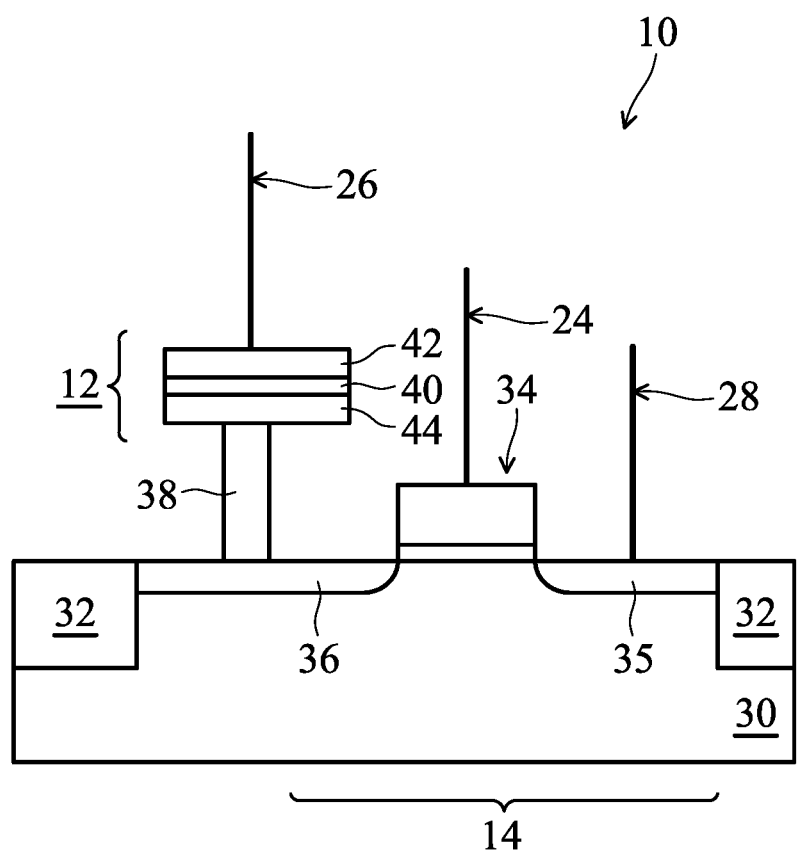
FIG. 3 is a sectional view of a memory cell having a resistive memory element and a FET constructed according to aspects of the present disclosure in one embodiment.

FIG. 3 illustrates a sectional view of the memory cell 10 that includes the FET 14 and the resistive memory element 12 formed on a substrate 30 and coupled together. The memory cell 10 is one embodiment of the RRAM structure 10 in FIG. 1. The memory cell 10 and the method making the same are collectively described with reference to FIG. 3.

In one example, the substrate 30 is a semiconductor substrate, such as a silicon substrate or alternatively other suitable semiconductor substrate. Various isolation features 32, such as shallow trench isolation (STI) features are formed on the substrate 30 and define various active regions. The FET 14 includes a gate 34 disposed on the substrate 30. The gate includes a gate dielectric layer and a gate electrode disposed on the gate dielectric layer. In various embodiments, the gate dielectric layer includes a dielectric material layer, such as high k dielectric material, silicon oxide, or other suitable dielectric material. In one example, the gate dielectric layer includes an interfacial layer and a high k dielectric material disposed on the interfacial layer. In other embodiments, the gate electrode includes polysilicon, metal, metal alloy, silicide or other suitable conductive material. In one example, the gate includes an interfacial layer, a high k dielectric material layer and a metal layer.

The FET 14 further includes a source 35 and a drain 36 formed in the substrate 30. The gate 34 is horizontally interposed between the source 35 and the drain 36. The source 35 and the drain 36 are asymmetric. The asymmetric source 35 and drain 36 means that the source 35 and drain 36 are different from each other in at least one of doping concentration, doping profile and doping species.

The asymmetric source 35 and drain 36 are separately formed such that the source and drain are independently tuned, resulting in an asymmetric source and drain structure. In one embodiment, the source 35 is formed by a first ion implantation process, and the drain 36 is formed by a second ion implantation process. The second ion implantation process is different from the first ion implantation process in at least one of doping dose, implanting angle and dopant (doping species). In one embodiment, the first ion implantation process includes forming a first patterned mask on the substrate, and applying the first ion implantation to the substrate using the first patterned mask as an implantation mask. The first patterned mask includes an opening such that a substrate region for the source is uncovered thereby. The first patterned mask is a patterned photoresist layer formed by a lithography process or alternatively a patterned hard mask formed by lithography process and etching. Similarly, the second ion implantation process includes forming a second patterned mask on the substrate, and applying the second ion implantation to the substrate using the second patterned mask as an implantation mask. The second patterned mask includes an opening such that a substrate region for the drain is uncovered thereby. The second patterned mask is similar to the first patterned mask in terms of formation and composition.

In one embodiment, the source 35 has a first doping concentration and the drain 36 has a second doping concentration different from (e.g., greater than) the first doping concentration. In this case, the first and second ion implantations have respective doping doses different from each other.

In another embodiment, the source 35 has a first doping profile and the drain 36 has a second doping profile different from the first doping profile. In this case, the first and second ion implantations have respective plasma powers and/or implantation tilt angles different from each other to achieve different doping profile. For example, the first ion implantation process has an implantation tilt angle to short the channel length. The second ion implantation process may have a zero tilt angle or a different tilt angle.

In another embodiment, the source 35 and the drain 36 have different doping species (or dopant). In the present embodiment, the FET 14 is a n-type FET with n-type source and drain. The source 35 includes a first doping species selected from the group consisting of nitrogen, phosphorous, and arsenic. The drain has a second doping species selected from the same group but is different from the first doping species. For example, the first doping species is phosphorous and the second doping species is arsenic. In this case, the first ion implantation uses phosphorous as the doping species and the second ion implantations uses arsenic as the doping species.

In yet another embodiment, the first and second ion implantations are tuned with respective combinations of doping species, doping dose and implantation tilt angle.

The resistive memory element 12 includes a resistive material layer 40 interposed between a top electrode 42 and a bottom electrode 44. The resistive material layer 40 has a characteristic mechanism that its resistivity can be switched between a high resistance state and a low resistance state (or conductive), by applying an electrical voltage. In various embodiments, the resistive material layer 40 includes a high k dielectric material, such as metal oxide, metal oxynitride or combinations thereof. In the present embodiment, the resistive material layer 40 includes a transition metal oxide (TMO). In one example, the resistive material layer 40 includes zirconium oxide. In other examples, the resistive material layer 40 includes tantalum oxide or hafnium oxide.

The resistive memory element 12 may further include a capping layer disposed between the resistive material layer 40 and one of the electrodes. In one embodiment, the capping layer includes a conductive material that is capable of depriving oxygen from adjacent material. In one example, the capping layer includes titanium (Ti), tantalum (Ta) or hafnium (Hf). In another embodiment, the capping layer includes metal oxide. In yet other embodiments, the capping layer and the resistive material layer 40 are chosen to have a pair of a conductive material and a resistive material, such as titanium (Ti) and zirconium oxide; or tantalum and tantalum oxide; titanium and hafnium oxide; or hafnium and hafnium oxide.

The memory cell 10 also includes various conductive features 38 to provide electrical routing and connection. The resistive memory element 12 and the FET 14 are coupled together through one or more conductive features 38. In one embodiment, the drain 35 of the FET 14 is connected to the bottom electrode 44 of the resistive memory element 12. The gate 34 of the FET 14 is connected to the word line 24. The top electrode of the resistive memory element 12 is connected to the bit line 26. The source 35 of the FET 14 is connected to the source line 28. The conductive features 38 are portions of an interconnect structure formed on the substrate 30.

Figure 4:
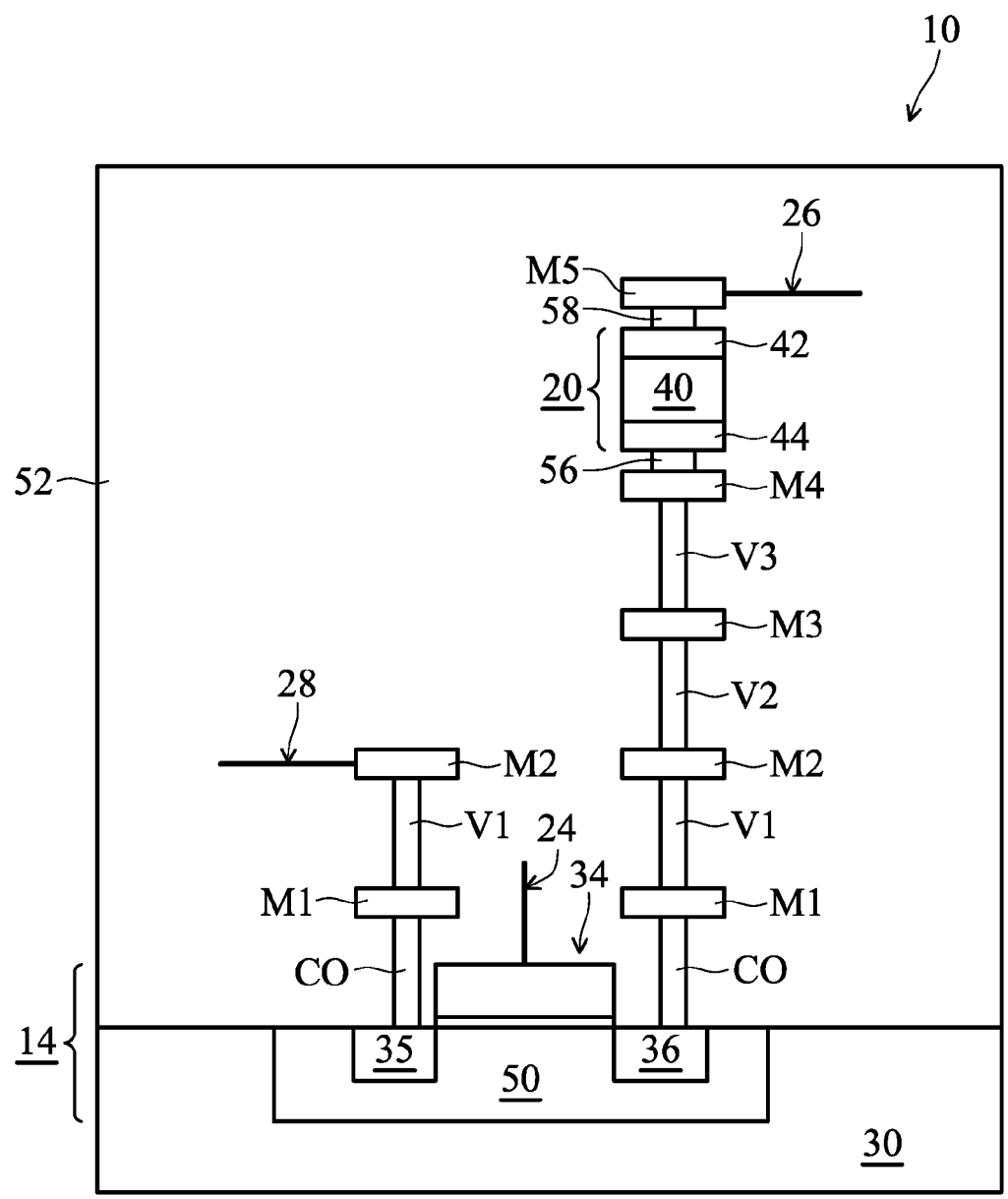
FIG. 4 is a sectional view of a memory cell of FIG. 3 having a resistive memory element and a FET constructed according to aspects of the present disclosure in another embodiment.

FIG. 4 is a sectional view of the memory cell 10 constructed according to aspects of the present disclosure in one embodiment. The memory cell 10 includes the FET 14 formed in the substrate 30. Particularly, the FET 14 includes the source 35 and the drain formed in a doped well 50. The doped well is doped with a first type. The source 35 and the drain 36 are doped with a second type opposite to the first type. In the present example, the FET 14 is an n-type FET (nFET). Accordingly, the doped well 50 is p-type well. The source 35 and the drain 36 are n-type. The FET 14 includes the gate 34 formed on the substrate 30. The gate 34 includes a gate dielectric layer and a gate electrode disposed on the gate dielectric layer. The gate 34 is electrically connected to the word line 24 and the source 35 is connected to the source line 28.

Particularly, the source 35 and drain 36 are asymmetric. The source 35 and drain 36 are different from each other in at least one of doping concentration, doping profile and doping species. The asymmetric source 35 and drain 36 are separately formed such that the source and drain are independently tuned, resulting in an asymmetric source and drain structure. In one embodiment, the source 35 is formed by a first ion implantation process, and the drain is formed by a second ion implantation process. The second ion implantation process is different from the first ion implantation process in at least one of doping dose, implanting angle and dopant. The asymmetric source 35 and drain 36 are described in FIG. 3. The similar description is not repeated here.

The resistive memory element 12 is formed in an interconnect structure 52. The interconnect structure 52 includes metal lines distributed in a plurality of metal layers, such as first metal layer (M1), M2 and so on. As an example for illustration, the interconnect structure 52 in FIG. 4 illustrates 5 metal layers that are respectively labeled as M1, M2, M3, M4 and M5. This is only an example not meant to limit the scope of the disclosure, the interconnect structure 52 may include more or less metal layers. The interconnect structure 52 also includes contact features to provide connection between the substrate 30 and the first metal layer M1. The contact features are labeled as "CO". The interconnect structure 52 also includes via features to provide connection between adjacent metal layers (such as M1 and M2). The via features are labeled as V1, V2, V3 and V4 to represent the via features between M1 & M2, M2 & M3, and M3 & M4, respectively.

The resistive memory element 12 is formed in the interconnect structure 52 and is disposed between two metal layers. In the example illustrated in FIG. 4, the resistive memory element 12 is disposed between M4 and M5. The resistive memory element 12 includes the resistive material layer 40 interposed between the top electrode 42 and the bottom electrode 44. The bottom electrode 44 is directly contacted with a bottom via feature 56 and is further coupled to the drain 36 of the FET 14. The top electrode 42 is directly contacted with a top via feature 58 and is further coupled to the bit line 26.

The memory cell 10 may include other features, such as shallow trench isolation (STI) formed in the substrate 30 to provide isolation to various memory cells and other circuit devices. In another embodiment, the source line 28 is connected to the source 35 through various conductive features, such as conductive features in CO, M1, V1 and M2 in this example.

Figure 5:
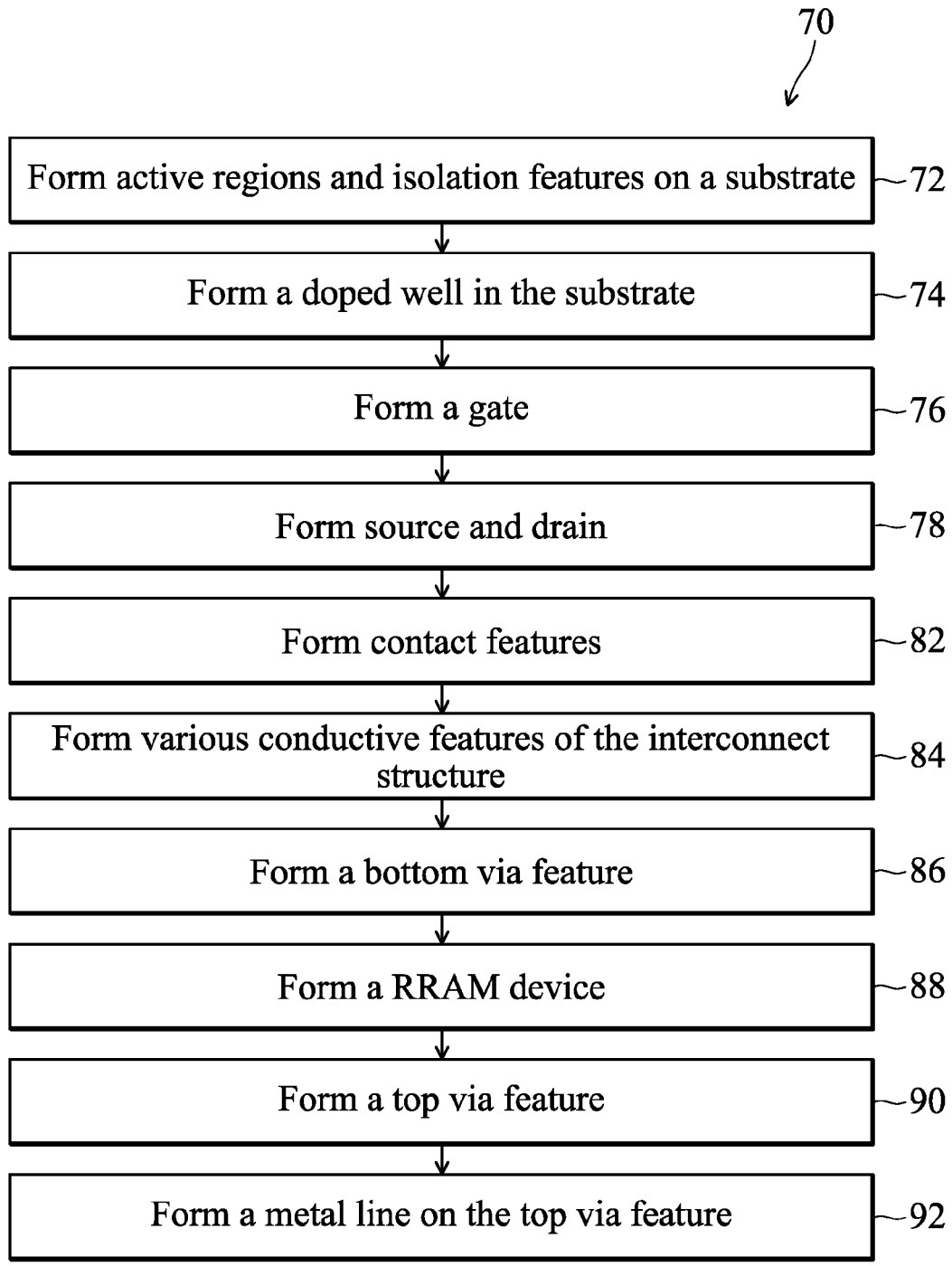
FIG. 5 is a flowchart of a method making a RRAM structure constructed according to aspects of the present disclosure in one or more embodiments.

FIG. 5 is a flowchart of a method 70 making of the memory cell 10 constructed according to aspects of the present disclosure in various embodiments. With references to FIGS. 3 through 5 and other figures, the method 70 making the memory cell 10 is described according to various embodiments.

The method 70 includes an operation 72 to form isolation features in the substrate 30. In one example, the isolation features include STI features that are formed by a procedure including etching and deposition. In one example to form the STI features, an etching process is applied to form trenches in the substrate. One or more dielectric material is deposited in the trenches. A polishing process, such as chemical mechanical polishing (CMP), is performed to planarize the surface of the substrate. After the formation of the isolation features, the active regions are defined in the substrate 30 for the RRAM cell 10 and other devices to be formed thereon.

The method 70 includes an operation 74 to form the doped well 50 by a suitable technique, such as ion implantation. The method 70 includes an operation 76 to form the gate 34. In operation 76, the gate material layers are deposited and patterned to the gate 34.

The gate material layers include the gate dielectric layer and the gate electrode layer. In one embodiment, the gate dielectric layer includes silicon oxide, high k dielectric material or other suitable dielectric material. The gate electrode layer includes metal, polycrystalline silicon (polysilicon) or other suitable conductive material. In one embodiment, the gate material layers include high k dielectric material and metal, therefore, referred to as high k metal gate. In one embodiment, the gate dielectric layer includes an interfacial layer (such as silicon oxide) and a high k dielectric material layer, such as hafnium oxide (HfO) or other suitable metal oxide. The gate electrode layer includes a metal (or metal alloy) layer and may further include a polysilicon layer on the metal layer.

In one embodiment, the formation of the interfacial layer (silicon oxide in the present example) includes thermal oxidation, atomic layer deposition (ALD), CVD or other suitable technology. In another embodiment, the formation of the high k dielectric material layer includes ALD, metalorganic CVD (MOCVD), physical vapor deposition (PVD), or other suitable technology. In yet another embodiment, the formation of the metal layer includes PVD, plating, or other suitable technology. In yet another embodiment, the formation of the polysilicon layer includes CVD or other suitable technology.

The formed gate material layers are further patterned to form the gate 34. In one example, the patterning the gate material layers includes forming a patterned photoresist layer on the gate material layers, performing an etch process to the gate material layers using the patterned photoresist layer as an etch mask, and removing the patterned photoresist layer thereafter by wet stripping or plasma ashing. In one example, the etch process includes more than one etch steps using different etchants to etch respective materials in the gate material layers. Each etchant is designed to effectively etch the respective material.

The method 70 also includes an operation 78 to form asymmetric source 35 and drain 36 of the FET 14. The gate 34 is horizontally interposed between the source 35 and the drain 36. The source 35 and drain 36 are different from each other in at least one of doping concentration, doping profile and doping species. The asymmetric source 35 and drain 36 are formed by various ion implantations.

The asymmetric source 35 and drain 36 are separately formed such that the source and drain are independently tuned, resulting in an asymmetric source and drain structure. In one embodiment, the source 35 and drain 36 include light doped drain (LDD) source and drain features and further include heavily doped source and drain features (HDD source and drain features). In this embodiment, the LDD source and drain features are formed after the formation of the gate 34. Gate spacer is further formed on sidewall of the gate 34. Thereafter, HDD source and drain features are formed. Particularly, the LDD source is formed by a first ion implantation process, and the LDD drain is formed by a second ion implantation process. The second ion implantation process is different from the first ion implantation process in at least one of doping dose, implanting angle and dopant (doping species). In one embodiment, the first ion implantation process includes forming a first patterned mask on the substrate, and applying the first ion implantation to the substrate using the first patterned mask as an implantation mask. The first patterned mask includes an opening such that a substrate region for the source is uncovered thereby. The first patterned mask is a patterned photoresist layer formed by a lithography process. Alternatively a patterned hard mask is formed by lithography process and etching. Similarly, the second ion implantation process includes forming a second patterned mask on the substrate, and applying the second ion implantation to the substrate using the second patterned mask as an implantation mask. The second patterned mask includes an opening such that a substrate region for the drain is uncovered thereby. The second patterned mask is similar to the first patterned mask in terms of formation and composition.

In one embodiment, the LDD source feature has a first doping concentration and the LDD drain feature has a second doping concentration different from the first doping concentration. In this case, the first and second ion implantations have respective doping doses different from each other.

In another embodiment, the LDD source feature has a first doping profile and the LDD drain feature has a second doping profile different from the first doping profile. In this case, the first and second ion implantations have respective plasma powers and/or implantation tilt angles different from each other to achieve different doping profile. For example, the first ion implantation process has an implantation tilt angle to short the channel length. The second ion implantation process may have a zero tilt angle or a different tilt angle.

In another embodiment, the LDD source feature and the LDD drain feature have different doping species. In the present embodiment, the FET 14 is a n-type FET with n-type source and drain. The LDD source feature includes a first doping species selected from the group consisting of nitrogen, phosphorous, and arsenic. The LDD drain feature has a second doping species selected from the same group but is different from the first doping species. For example, the first doping species is phosphorous and the second doping species is arsenic. In this case, the first ion implantation uses phosphorous as the doping species and the second ion implantations uses arsenic as the doping species.

In yet another embodiment, the first and second ion implantations are tuned with respective combinations of doping species, doping dose and implantation tilt angle.

The method 70 may include an operation to form silicide features on the source 35 and drain 36 for reduced contact resistance. Salicide may be further formed on the gate. In one embodiment, the silicide features are formed by a procedure including metal deposition, annealing and etching.

The method 70 includes an operation 82 to form contact features "CO" by a suitable procedure that includes dielectric deposition, lithography patterning and etching. The method 70 includes an operation 84 to various interconnect features. In the present embodiment, the operation 84 includes forming various conductive features including M1, V1, M2, V2, M3, V3 and M4. In one embodiment, each metal layer, including metal lines and the via features, is formed by a damascene process including dielectric material deposition, etching to form trenches, metal deposition to fill in the trenches and CMP to remove the excessive metal. In another embodiment, each metal layer is formed by metal deposition, metal patterning and dielectric deposition. The method 70 includes an operation 86 to form a bottom via feature 56. In one embodiment, the bottom via feature 56 is formed by a damascene process.

The method 70 includes an operation 88 to form a resistive memory element 12. The formation of the resistive memory element 12 includes deposition and patterning to form bottom electrode 42, resistive material layer 40 and top electrode 44. The method 70 includes an operation 90 to form a top via feature 56. In one embodiment, the top via feature 56 is formed by another damascene process.

The method 70 includes an operation 92 to form a metal line on the top via feature 56. In the present example, the metal line is in the fifth metal layer. The formation of the metal line in the fifth metal layer is similar to the formation of the metal lines in the other metal layers. For example, the metal line on the top via feature 56 is formed by a damascene process. In another embodiment, the metal line is formed by metal deposition and patterning.

The formation of the asymmetric source 35 and drain 36 of the FET 14 is further described with reference to FIGS. 6 through 10 as sectional views of the FET 14 (or the memory cell 10 in portion) at various fabrication stages constructed according to aspects of the present disclosure in one or more embodiments.

Figure 6:
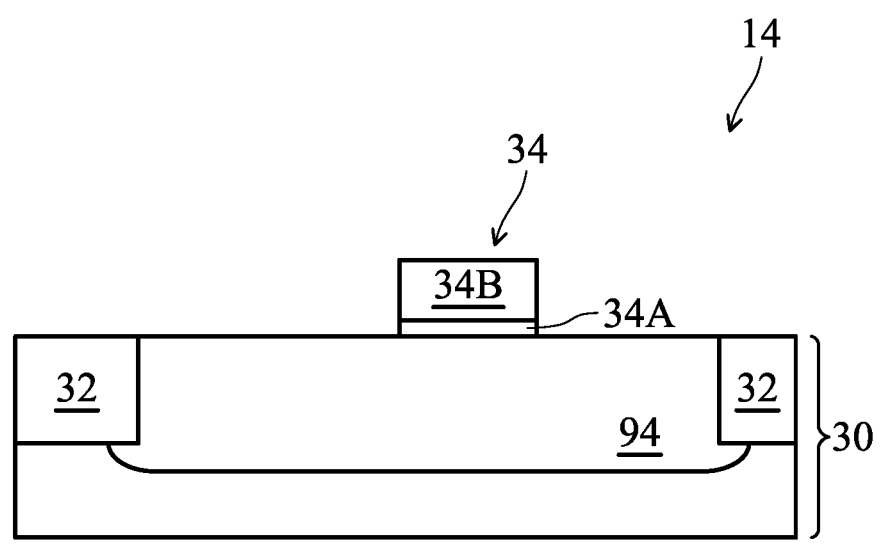
FIGS. 6 through 10 are sectional views of a RRAM structure, in portion, at various fabrication stages constructed according to aspects of the present disclosure in one embodiment.

Referring to FIG. 6, the FET 14 is formed on the substrate 30. Various STI features 32 may be formed to define active regions. A doped well 94 is formed in the substrate 30 within one active region. In the present embodiment, the FET is a n-type FET and the dopes well 94 is a p-type well formed by a procedure including ion implantation. The gate 34 is formed on the doped well 94 by deposition and patterning, as described above. The gate 34 includes gate dielectric layer 34A and gate electrode 34B.

Figure 7:
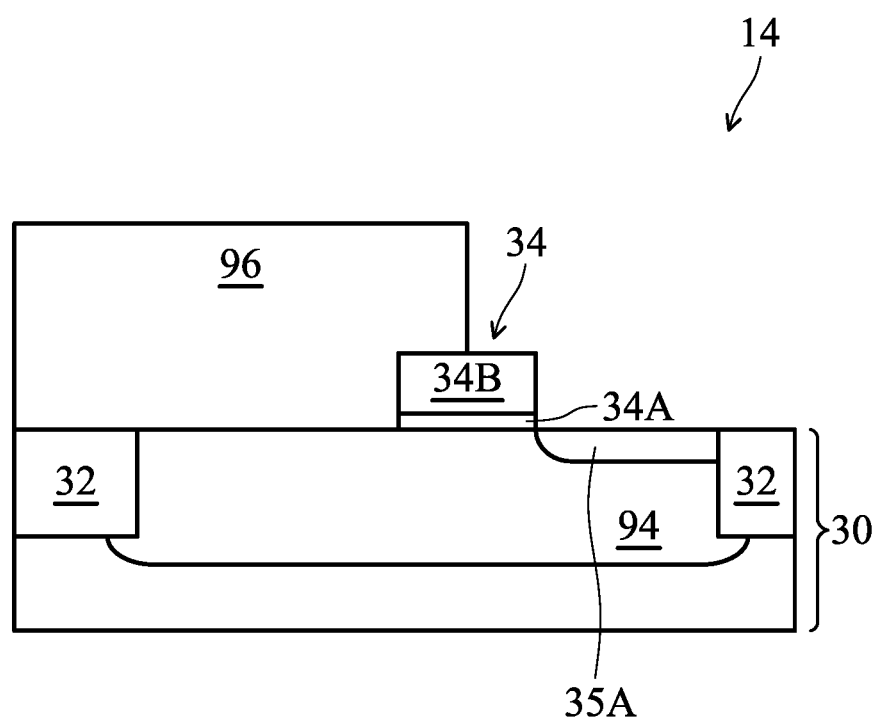

Referring to FIG. 7, a patterned photoresist layer 96 is formed on substrate 30 by a lithography process including coating, exposure and developing (and various baking). The patterned photoresist layer 96 is patterned to cover the region for the drain 36 and has an opening with the region for the source 35 uncovered thereby.

A first ion implantation process is applied to the substrate 30 using the patterned photoresist layer 96 as the implantation mask, forming light doped source (or LDD source feature) 35A. The first ion implantation process is tuned to have a first doping species, a first dose and a first implantation tilt angle. When the first implantation tilt angle is not zero, the LDD source feature 35A is not be aligned with the gate.

Figure 8:
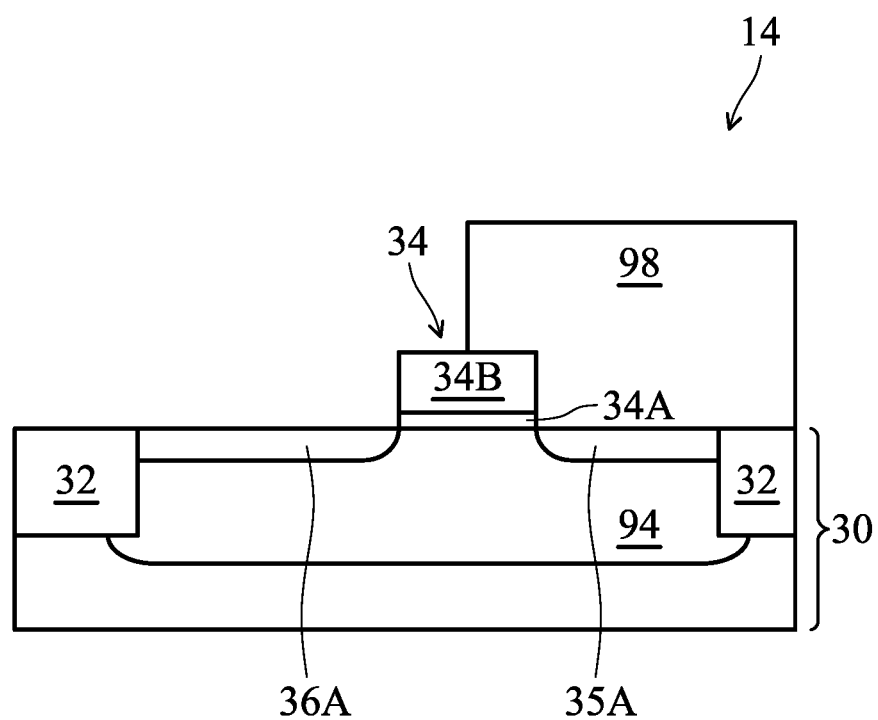

Referring to FIG. 8, a patterned photoresist layer 98 is formed on substrate 30 by a lithography process. The patterned photoresist layer 98 is patterned to cover the region for the source 35 and has an opening with the region for the drain 36 uncovered thereby.

A second ion implantation process is applied to the substrate 30 using the patterned photoresist layer 98 as the implantation mask, forming light doped drain (or LDD drain feature) 36A. The second ion implantation process is different from the first ion implantation process and is tuned to have a second doping species, a second dose and a second implantation tilt angle.

As the LDD source feature 35A and LDD drain feature 36A are independently formed and are able to be tuned independently in terms of doping species, doping dose, implantation tilt angle or combination thereof, one of 35A and 36A is tuned to reduce the off-state resistance of the FET 14, another one is tuned oppositely to reduce the leakage. For example, the LDD source 35A is tuned to have a higher doping concentration, less mass of the doping species (such as nitrogen or phosphorous), an implantation tilt angle (to reduce the channel length), or a combination thereof. In contrast, the LDD drain feature 36A is tuned to have a lower doping concentration, more mass of the doping species (such as arsenic), without implantation tilt angle, or a combination thereof. Thus formed FET 14 has various advantages in various embodiments.

In one embodiment, the FET 14 has an enlarged junction breakdown voltage and is able to withstand the high forming voltage during the forming operation. The reset voltage is reduced due to the reduced body effect.

Figure 9:
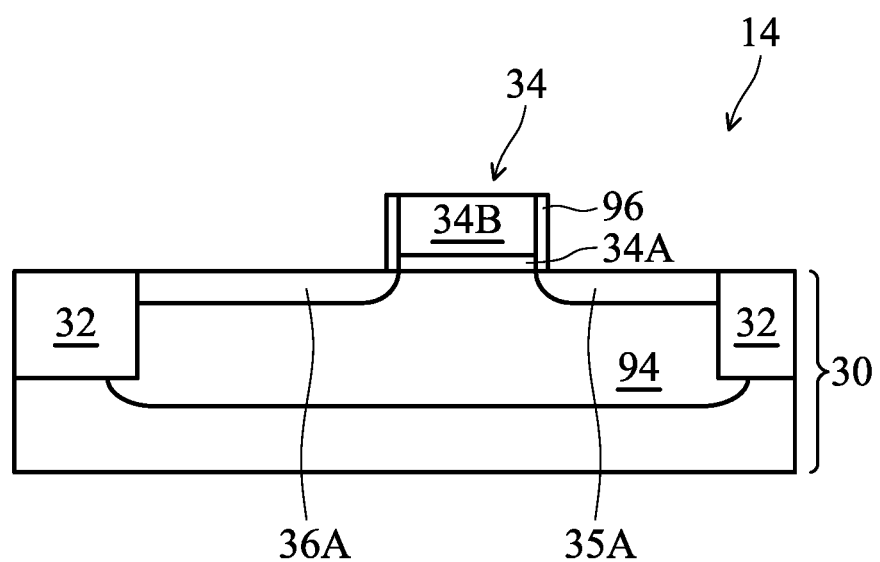

Referring to FIG. 9, a gate spacer 96 may be further formed on sidewalls of the gate 34 by deposition and etching. The gate spacer 96 includes a dielectric material such as silicon oxide, silicon nitride, other suitable dielectric material or a combination thereof. The deposition may include CVD or other suitable technique. The etching process includes an anisotropic etch process, such as a dry etch.

Figure 10:
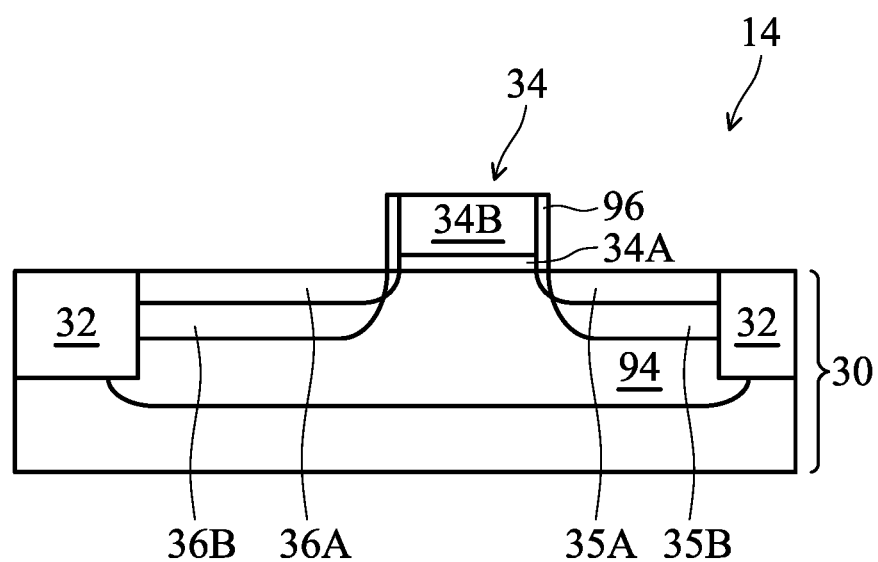

Referring to FIG. 10, the heavily doped source feature 35B and drain feature 36B are formed after the formation of the gate spacer by an ion implantation. An annealing process may be further applied to the substrate 30 to collectively activate the source 35 and the drain 36.

Figure 11:
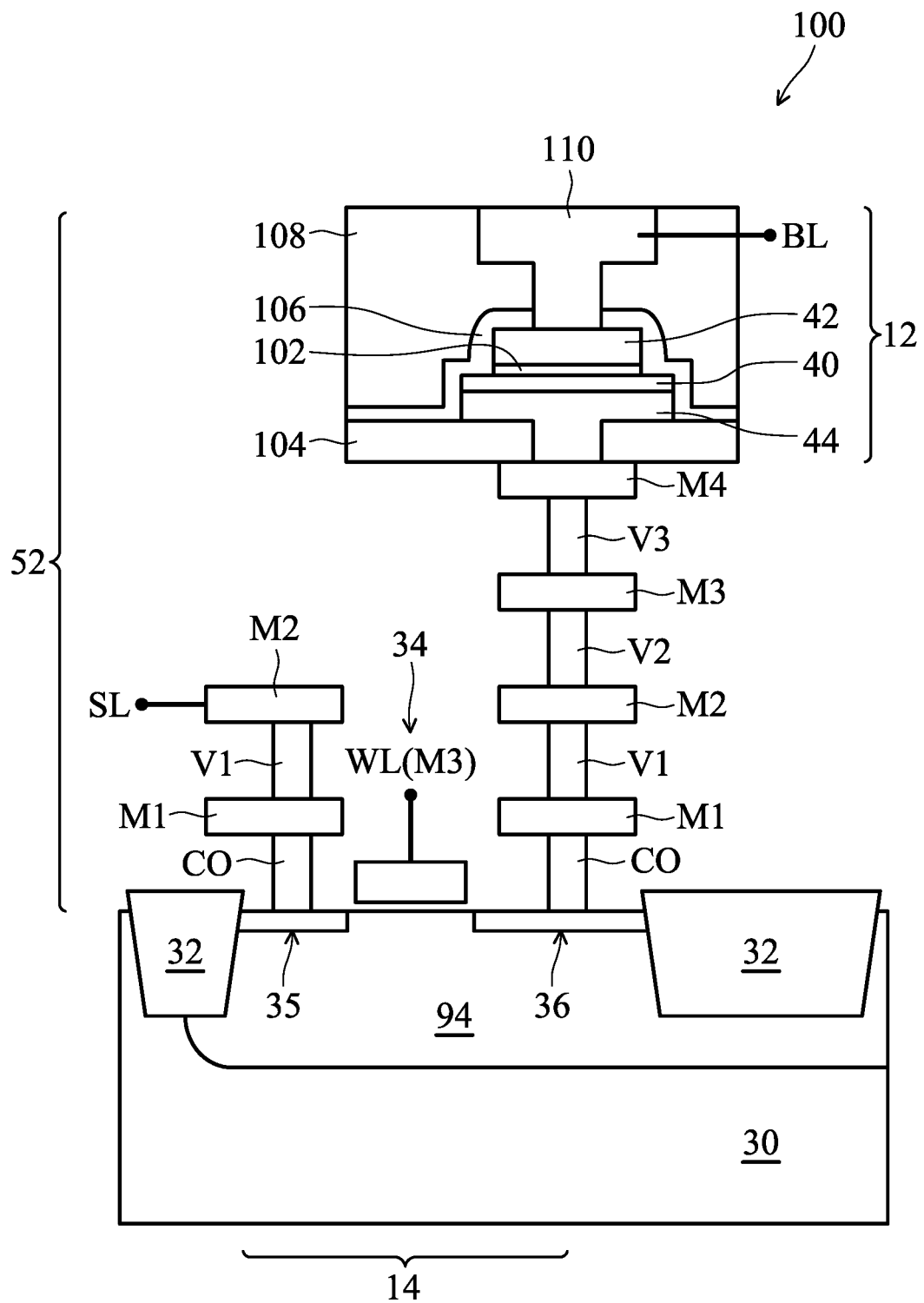
FIG. 11 is a sectional view of a RRAM cell having a resistive memory element and a FET constructed according to aspects of the present disclosure in another embodiment.

FIG. 11 is a sectional view of a memory cell 100 constructed according to aspects of the present disclosure in one or more embodiment. The memory cell 100 is similar to the memory cell 10. For example, the memory cell 100 includes a resistive memory element 12 and the FET 14 coupled together in the same configuration. The FET 14 includes asymmetric source and drain formed in the same way. In FIG. 11 (and in FIGS. 12 through 18 as well), the source line 28 is labeled as "SL", the word line 24 is formed in the third metal layer and is labeled as "WL(M3)", and the bit line 26 is labeled as "BL". Other similar descriptions are not repeated here for simplicity. The resistive memory element 12 includes a resistive material layer 40, top electrode 42 and bottom electrode 44, further includes a capping layer 102 sandwiched between the top electrode 42 and the resistive material layer 40. The resistive memory element 12 is formed in the interconnect structure 52. Various dielectric material layers are present, such as 104, 106 and 108. A metal feature 110 is formed on the top electrode 42 and is a metal line in a metal layer. In the present example, the metal feature 110 is a metal line in the metal 5 (M5). The structure of the resistive memory element 12 and the method making the same are further described with reference to FIGS. 12 through 19, as sectional views of the memory cell 100 at various fabrication stages constructed according to one or more embodiment.

Figure 12:
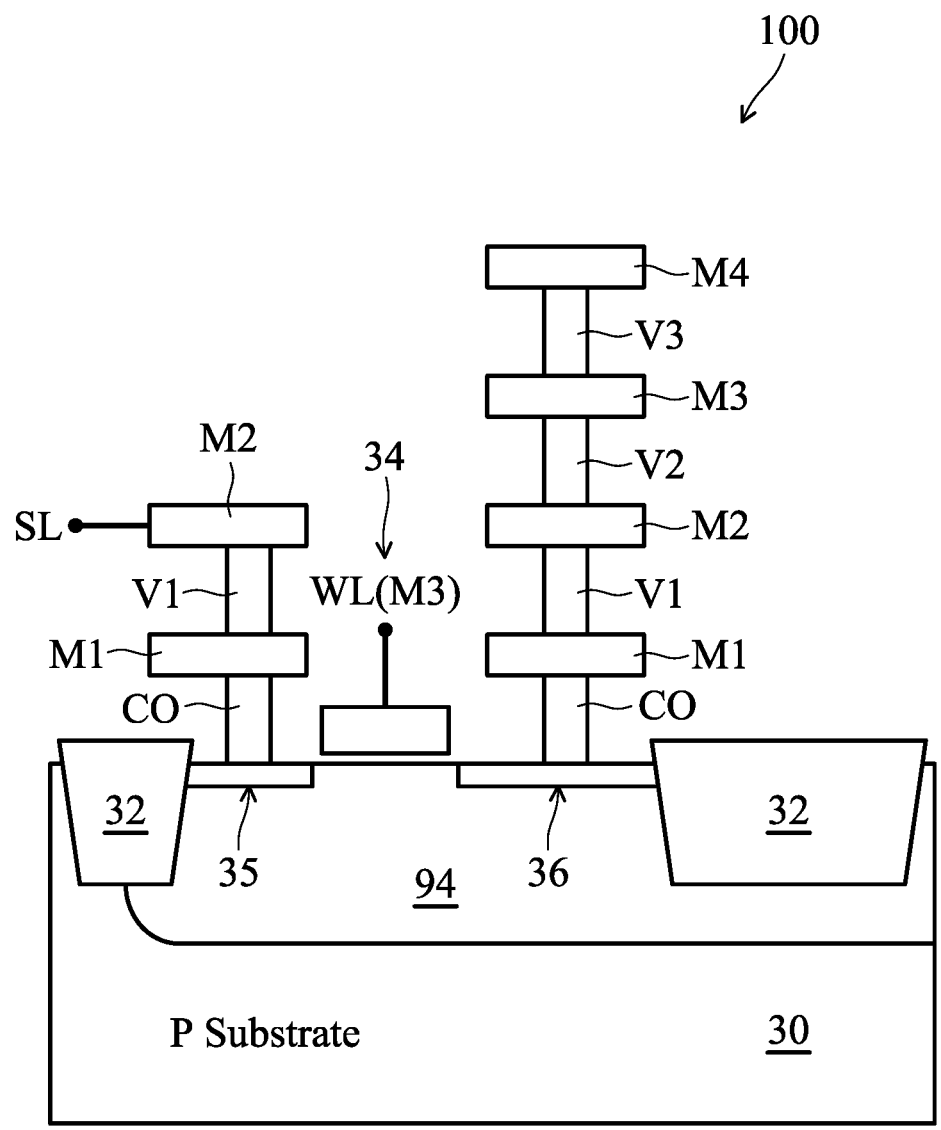
FIGS. 12 through 18 are sectional views of the RRAM structure of FIG. 11 at various fabrication stages constructed according to aspects of the present disclosure in one embodiment.

Referring to FIG. 12, the FET 14 and a portion of the interconnect structure 52 are formed on the substrate 30. The FET 14 has an asymmetric source and drain.

Figure 13:
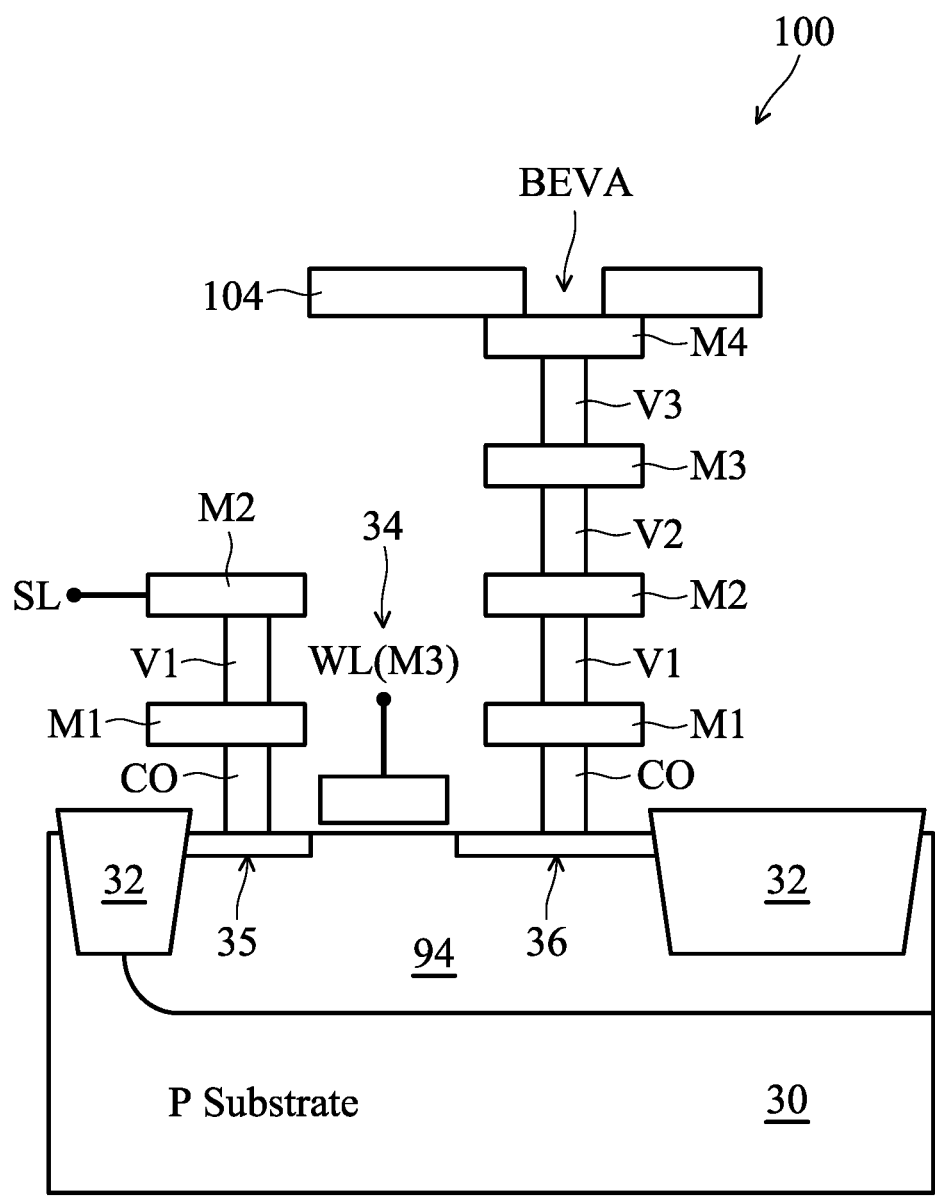

Referring to FIG. 13, a dielectric material layer 104 is deposited (such as by CVD) and is patterned (by lithography patterning and etching) to form bottom electrode via ("BEVA"). The dielectric material layer 104 includes silicon oxide, silicon nitride or other suitable dielectric material. The dielectric material layer 104 is also used as an etch stop layer during the subsequent etching.

Figure 14:
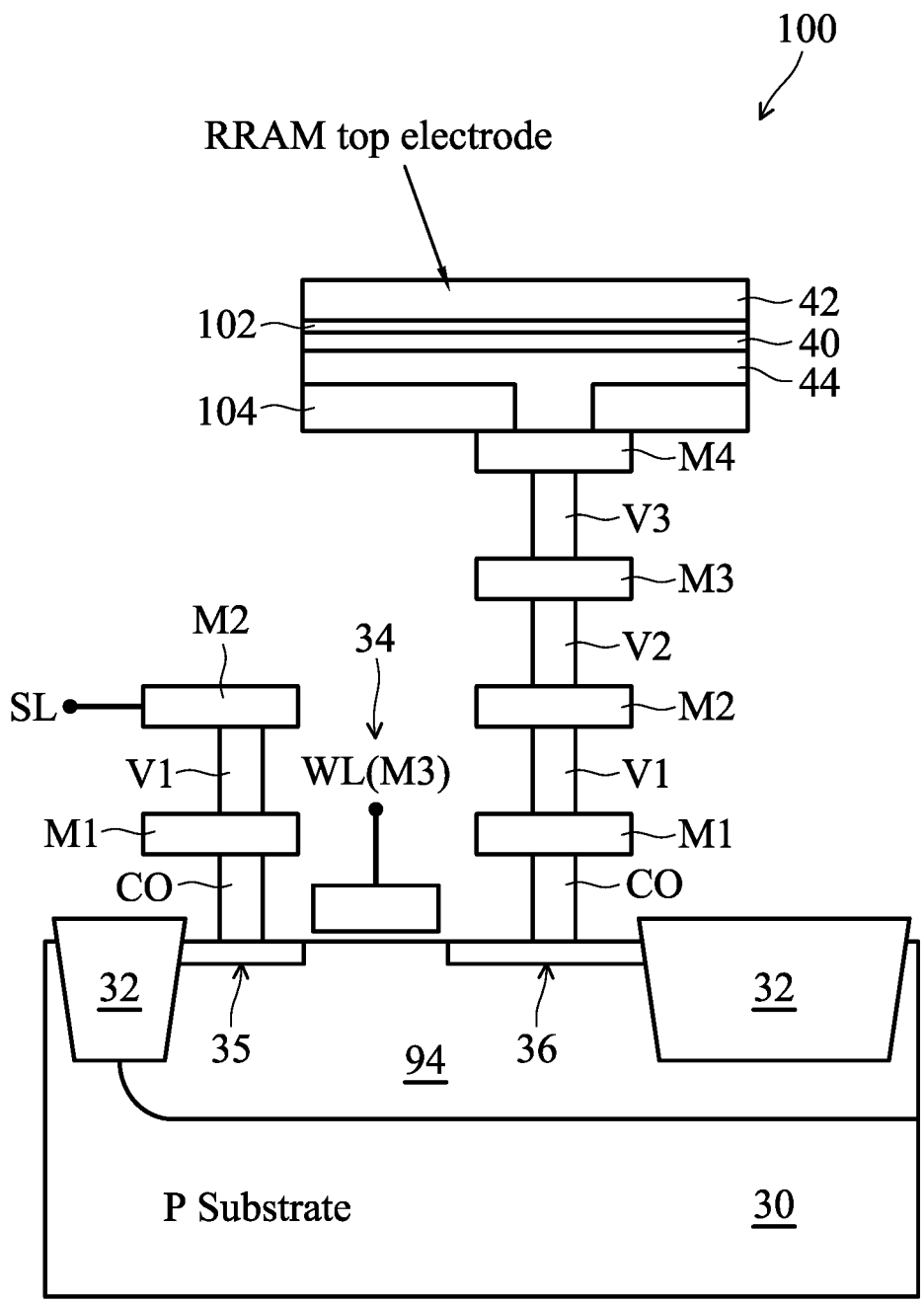

Referring to FIG. 14, deposited are various material layers including bottom electrode 44, resistive material layer 40, capping layer 102 and the top electrode 42.

The bottom electrode 44 includes a conductive material. In one embodiment, the bottom electrode 44 includes titanium nitride (TiN). In another embodiment, the bottom electrode 44 includes tantalum nitride (TaN) or platinum (Pt). In other embodiments, the bottom electrode 44 may include other appropriate conductive materials, such as tungsten, copper, aluminum or combinations thereof. The bottom electrode 44 can be formed by atomic layer deposition (ALD), physical vapor deposition (PVD or sputtering), or alternatively other suitable processes.

The resistive material layer 40 is deposited on the bottom electrode 44. The resistive material layer 40 has a characteristic mechanism that its resistivity can be switched between a high resistance state and a low resistance state (or conductive), by applying an electrical voltage. In various embodiments, the resistive material layer 40 includes metal oxide, metal oxynitride or combinations thereof. In the present embodiment, the resistive material layer 40 includes a transition metal oxide. In one example, the resistive material layer 40 includes zirconium oxide. In other examples, the resistive material layer 40 includes tantalum oxide or hafnium oxide. The resistive material layer 40 may be formed by a suitable technique, such as ALD with a precursor containing zirconium and oxygen. In another example, the resistive material layer 40 may be formed by PVD, such as a PVD process with a zirconium target and with a gas supply of oxygen to the PVD chamber. The resistive material layer 40 has a proper thickness for improved memory device performance including retaining time, reliable data storage, and writing easiness. In one example, the resistive material layer 40 includes a thickness ranging between about 20 angstrom and about 200 angstrom.

The capping layer 102 is formed on the resistive material layer 40. The capping layer 102 includes a conductive material that is unstable and is capable of depriving oxygen from adjacent material. In the present embodiment, the capping layer 102 includes titanium (Ti) and may be formed by PVD or other suitable technique.

In other embodiments, the capping layer 102 includes Ti, tantalum (Ta) or hafnium (Hf). In another embodiment, the capping layer 102 includes metal oxide. In yet other embodiments, the capping layer 102 and the resistive material layer 40 are chosen to have a pair of a conductive material and a resistive material, such as titanium (Ti) and zirconium oxide; or tantalum and tantalum oxide; titanium and hafnium oxide; or hafnium and hafnium oxide. However, the capping layer 102 may be eliminated in other embodiments.

The top electrode 42 is formed on the capping layer 102 or on the resistive material layer 40 (if the capping layer 102 is not present). In one embodiment, the top electrode 42 includes tantalum nitride (TaN). The top electrode 42 may be formed by PVD or other suitable technique. Alternatively, the top electrode 42 includes other suitable conductive material to electrically connect the device to other portion of an interconnect structure for electrical routing. For example, the top electrode 42 includes copper, tungsten, aluminum, doped polysilicon or other suitable conductive material.

Figure 15:
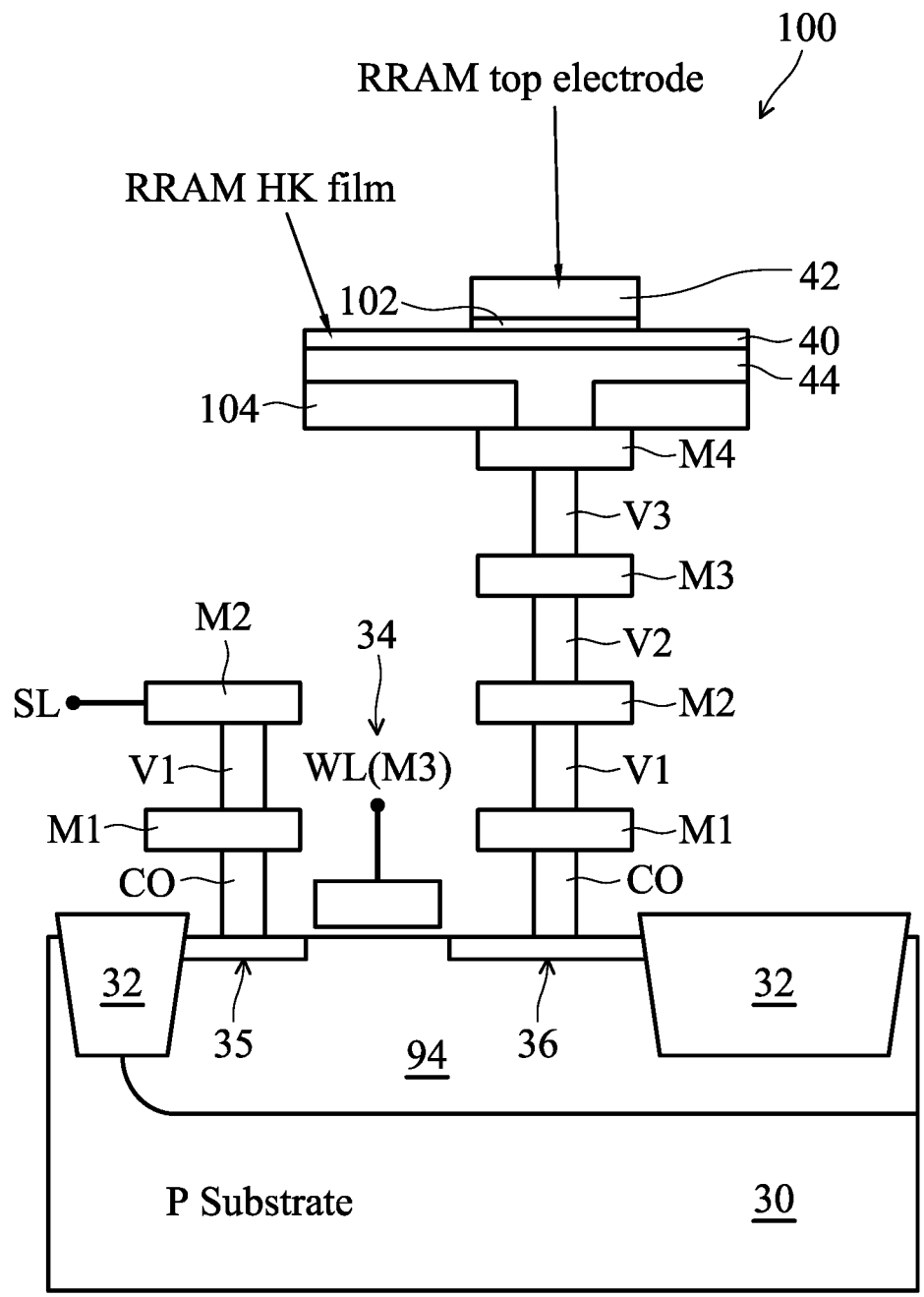

Referring to FIG. 15, the top electrode 42 and the capping layer 102 are defined by patterning. In one embodiment, the top electrode 42 and the capping 102 are patterned by a procedure that includes lithography process and etch. For example, a hard mask is deposited on the top electrode 42 and is patterned by a lithography process and an etch process; and then the various material layers (top electrode and capping layer) are etched through the openings of the hard mask. The etching process is tuned to stop on the resistive material layer 40. The hard mask is used as an etch mask and may include silicon oxide, silicon nitride, other suitable material. In another embodiment, a patterned resist layer is used as an etch mask.

Figure 16:
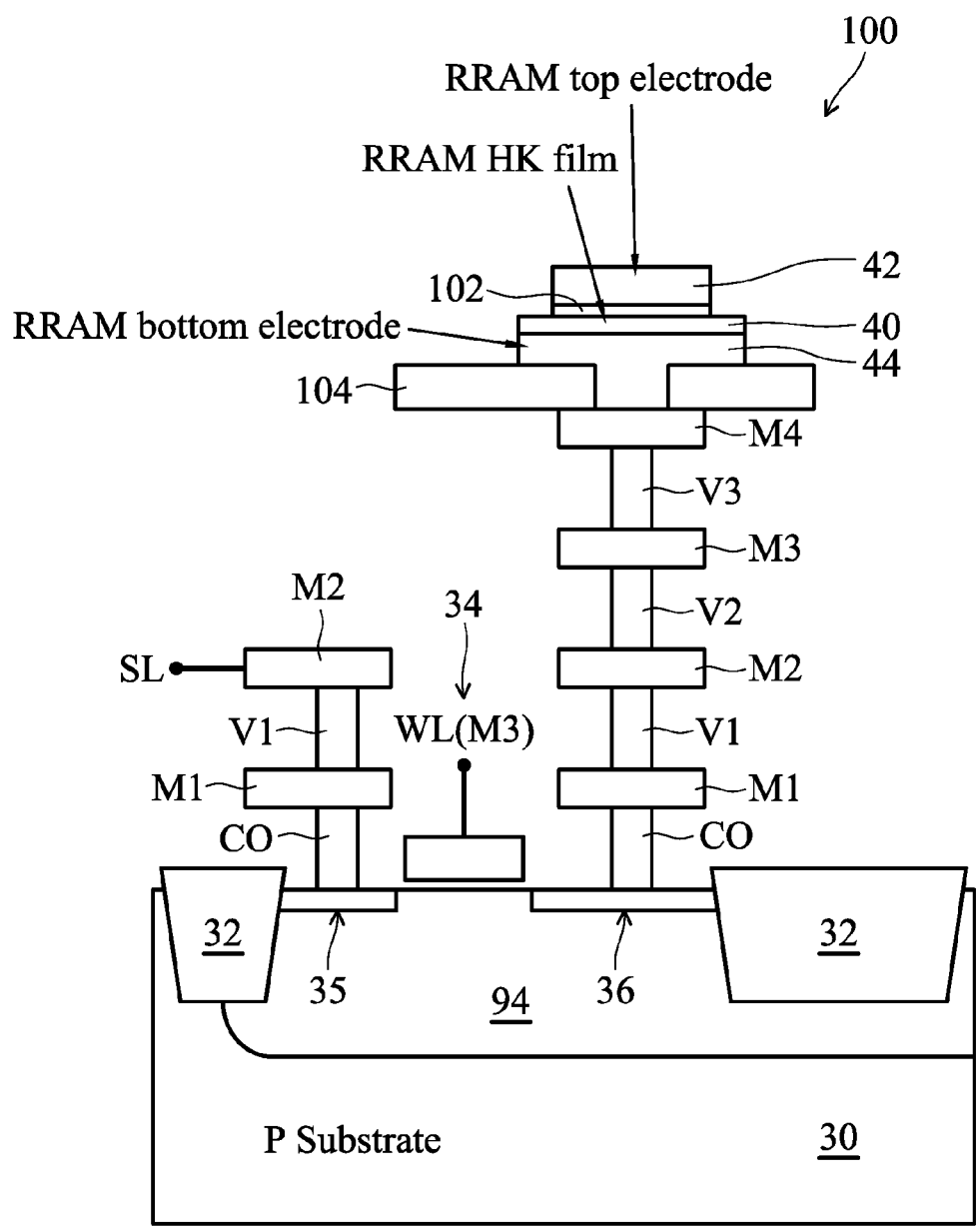

Referring to FIG. 16, the resistive material layer 40 and the bottom electrode 44 are patterned by a procedure including lithography process and etching. For example, a hard mask is deposited and is patterned by a lithography process and an etch process; and then the resistive material layer and the bottom electrode 44 are etched through the openings of the hard mask. In another embodiment, a patterned resist layer is alternatively used as an etch mask. The etch process is tuned to stop on the dielectric material layer 104.

Figure 17:
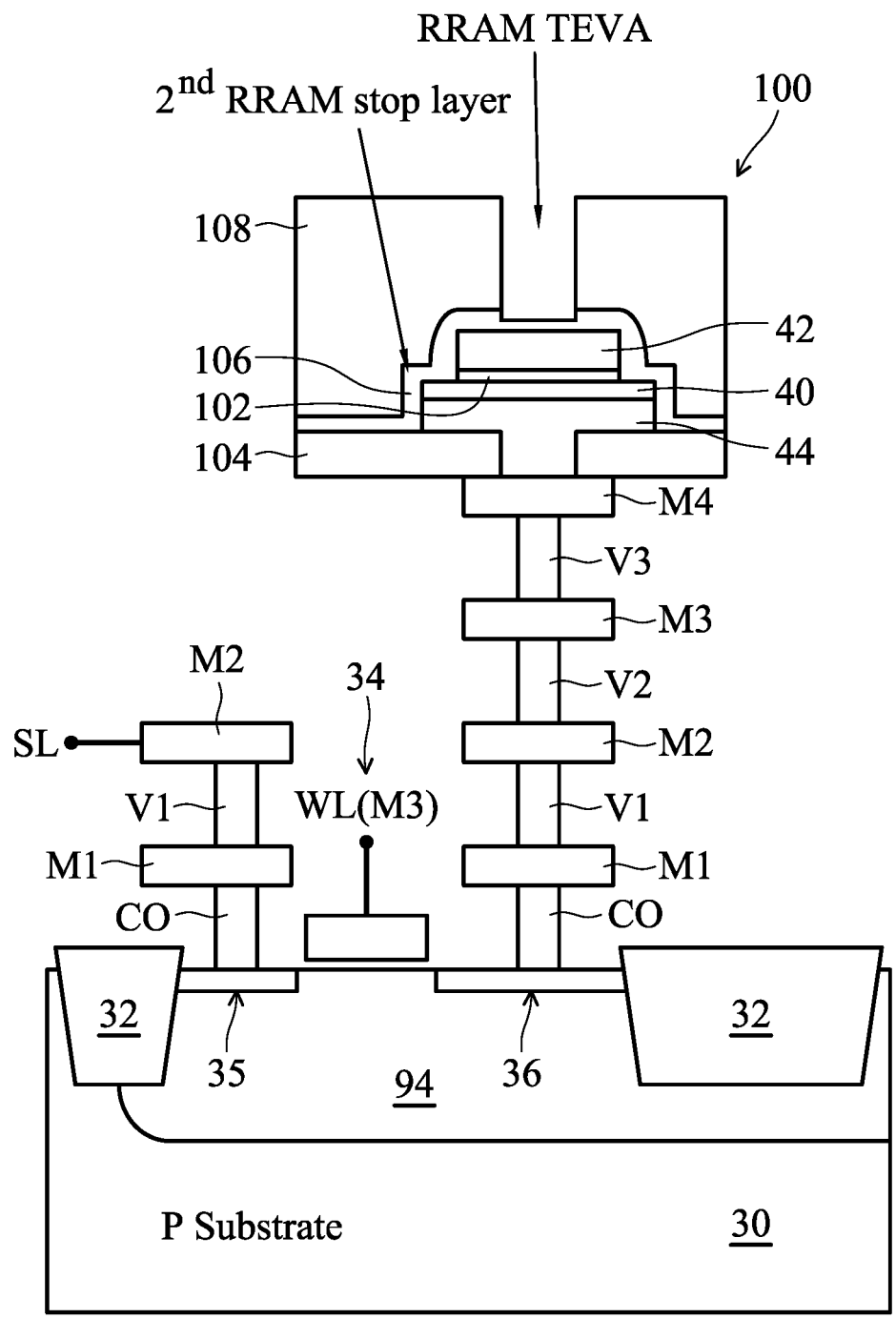

Referring to FIG. 17, a dielectric material layer 106 is formed on the resistive memory element 12. The dielectric material layer 106 may be deposited by CVD. The dielectric material layer 106 includes silicon oxide, silicon nitride or other suitable dielectric material. The dielectric material layer 106 is used as an etch stop layer during the subsequent etching.

Another dielectric material layer 108 is deposited and is further patterned to form top electrode via ("TEVA"). The dielectric material layer 108 includes a dielectric material, such as silicon oxide, low k dielectric material or other suitable dielectric material. The dielectric material layer 108 may be deposited by CVD, spin-on coating or other suitable technique. A CMP process may be further applied to planarize the top surface. The top electrode via is formed by a procedure including lithography patterning and etching.

Figure 18:
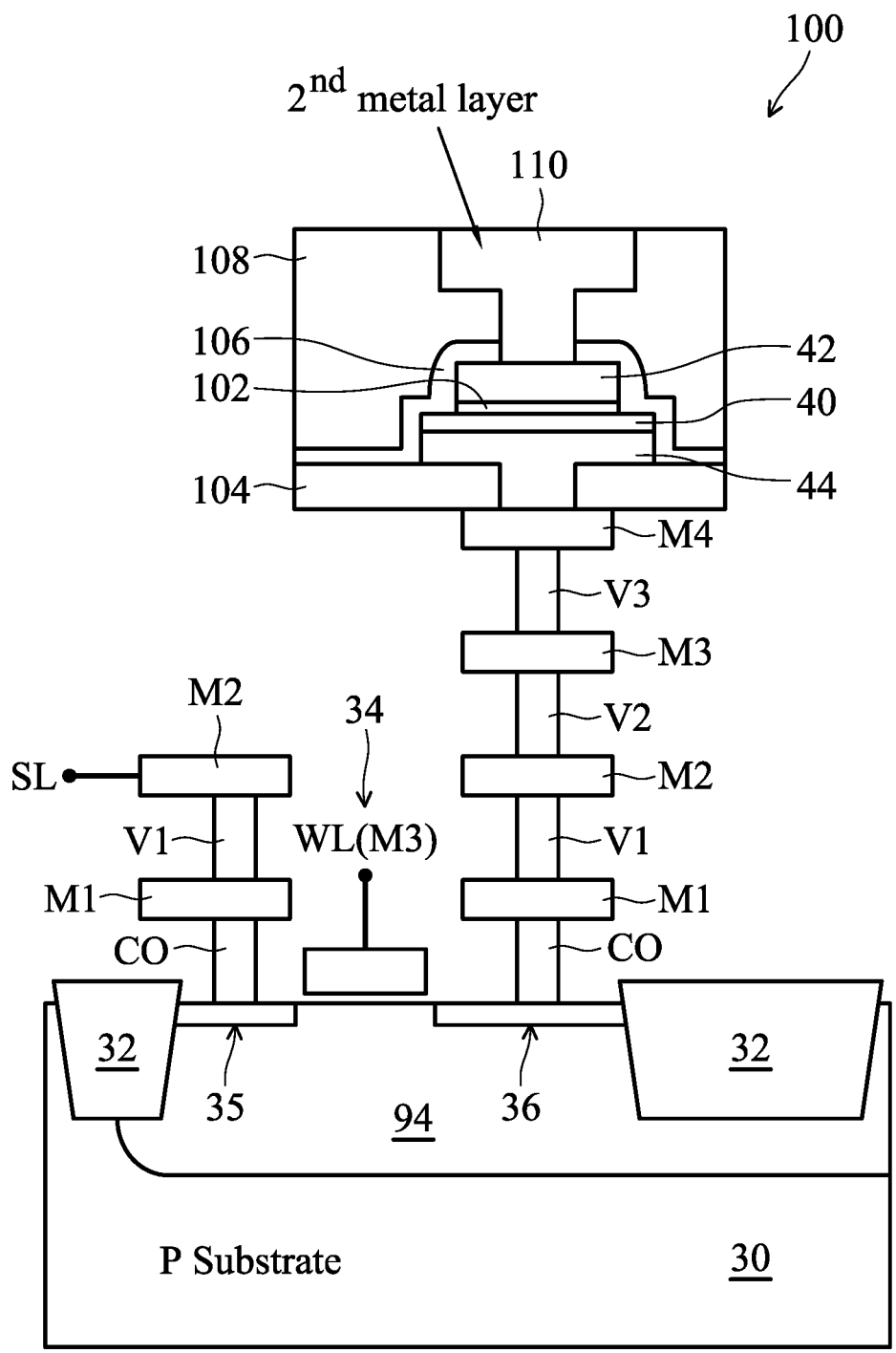

Referring to FIG. 18, a conductive material is deposited in the top electrode via by PVD or other suitable technique. Another CMP process is applied to remove the excessive conductive material above the dielectric material layer 106, resulting in the conductive feature 110.

In one embodiment, the conductive feature 110 is a metal feature in the corresponding metal layer (Metal 5 in the present example). The formation of the top electrode via and the conductive feature 110 is integrated with the damascene process to form metal lines and is simultaneously formed with other metal lines in the same metal layer. In furtherance of the embodiment, the conductive feature 110 includes copper and is deposited by a procedure including PVD to form a copper seed layer and plating to fill in the top electrode via with copper. A lining layer, such as titanium nitride, may be further formed on the sidewall of the top electrode via before the formation of the conductive feature 110. The conductive feature 110 is connected to the bit line.

The present disclosure provides one embodiment of a resistive random access memory (RRAM) structure. The RRAM structure includes a resistive memory element formed on a semiconductor substrate and designed for data storage; and a field effect transistor (FET) formed on the semiconductor substrate and coupled with the resistive memory element. The FET includes asymmetric source and drain. The resistive element includes a resistive material layer and further includes first and second electrodes interposed by the resistive material layer.

The present disclosure also provides another embodiment of a resistive random access memory (RRAM) cell. The RRAM cell includes resistive memory element formed on a semiconductor substrate; and a field effect transistor (FET) coupled with the resistive memory element. The resistive element includes a resistive material layer for data storage, and top electrode and bottom electrodes interposed by the resistive material layer. The FET includes a gate disposed on the semiconductor substrate, and source and drain formed in the semiconductor substrate and disposed on both sides of the gate. The source and drain are asymmetric.

The present disclosure provides an embodiment of a method for making a resistive random access memory (RRAM) cell that includes a field effect transistor (FET) and a resistive memory element coupled together. The method includes forming a gate of the FET on a semiconductor substrate; performing a first ion implantation process to form a source of the FET in the semiconductor substrate; performing a second ion implantation process to form a drain of the FET in the semiconductor substrate, wherein the second ion implantation process is different from the first ion implantation process; and forming resistive memory element configured to be electrically coupled with the FET.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A resistive random access memory (RRAM) structure, comprising:
    a resistive memory element formed on a semiconductor substrate and designed for data storage, wherein the resistive element includes
        a resistive material layer, and
        first and second electrodes interposed by the resistive material layer; and
    a field effect transistor (FET) formed on the semiconductor substrate and coupled with the resistive memory element, wherein the FET includes an asymmetric source and drain, the drain having a higher doping concentration than the source;
    wherein the resistive memory element is coupled with the drain.

2. The RRAM structure of claim 1, wherein the source and drain are designed asymmetrically such that a voltage drop over the FET during a forming operation and an off-state leakage current are collectively optimized.

3. The RRAM structure of claim 1, wherein the FET further includes:
    a channel region formed in the semiconductor substrate; and
    a gate vertically disposed over the channel region and horizontally interposed between the source and drain,
    wherein the source and drain of the FET further include light doped drain (LDD) source and drain features that are asymmetric.

4. The RRAM structure of claim 3, wherein:
    the LDD source feature has a first doping concentration; and
    the LDD drain feature has a second doping concentration different from the first doping concentration.

5. The RRAM structure of claim 3, wherein:
    the LDD source feature has a first doping species; and
    the LDD drain feature has a second doping species different from the first doping species.

6. The RRAM structure of claim 3, wherein:
    the LDD source feature has a first doping profile; and
    the LDD drain feature has a second doping profile different from the first doping profile.

7. The RRAM structure of claim 6, wherein the first doping species is one selected from the group consisting of nitrogen, phosphorous and arsenic; and the second doping species is another selected from the group.

8. The RRAM structure of claim 1, wherein the resistive material layer includes a transition metal oxide.

9. The RRAM structure of claim 8, wherein the resistive memory element further includes a capping layer disposed between the resistive material layer and one of the first and second electrodes.

10. The RRAM structure of claim 9, wherein the capping layer and the resistive material layer are a pair of materials selected from the group consisting of titanium and zirconium oxide; tantalum and tantalum oxide; titanium and hafnium oxide; and hafnium and hafnium oxide.

11. The RRAM structure of claim 1, wherein the drain of the FET is connected to the first electrode of the resistive memory element.

12. The RRAM structure of claim 11, wherein:
    the second electrode is connected to a bit line;
    the source of the FET is connected to a source line; and
    a gate of the FET is connected to a word line.

13. A resistive random access memory (RRAM) cell, comprising:
    a resistive memory element formed on a semiconductor substrate, wherein the resistive element includes a resistive material layer, and top electrode and bottom electrodes interposed by the resistive material layer; and
    a field effect transistor (FET) coupled with the resistive memory element, wherein the FET includes
        a gate disposed on the semiconductor substrate, and
        a source and a drain formed in the semiconductor substrate and disposed on both sides of the gate, the source having a lower doping concentration than the drain;
    wherein the resistive memory element is coupled with the drain.

14. The RRAM cell of claim 13, wherein the source and drain are different from each other in doping profile.

15. The RRAM structure of claim 14, wherein the source and drain of the FET further include light doped drain (LDD) source and drain features that are asymmetric.

16. The RRAM structure of claim 13, wherein the resistive material layer includes a transition metal oxide.

17. The RRAM structure of claim 13, wherein:
    the drain of the FET is connected to the bottom electrode of the resistive memory element;
    the top electrode of the resistive memory element is connected to a bit line;
    the source of the FET is connected to a source line; and
    the gate of the FET is connected to a word line.

18. A method for making a resistive random access memory (RRAM) cell that includes a field effect transistor (FET) and a resistive memory element coupled together, the method comprising:
    forming a gate of the FET on a semiconductor substrate;
    performing a first ion implantation process with a first doping species to form a source of the FET in the semiconductor substrate, the source having a first doping concentration;
    performing a second ion implantation process with a second doping species to form a drain of the FET in the semiconductor substrate, wherein the drain has a second doping concentration that is greater than the first doping concentration; and
    forming a resistive memory element configured to be electrically coupled with the drain of the FET.

19. The method of claim 18, wherein:
    the performing the first ion implantation process includes performing the first ion implantation process with a first doping dose; and the performing the second ion implantation process includes performing the second ion implantation process with a second doping dose different from the first doping dose.

20. The method of claim 18, wherein the performing the first ion implantation process further includes:
forming a first patterned mask on the semiconductor substrate, the first patterned mask having a first opening such that a first region for the source is uncovered thereby; and
applying the first ion implantation process to the semiconductor substrate using the first patterned mask as a first implantation mask; and
wherein the performing the second ion implantation process includes:
forming a second patterned mask on the semiconductor substrate, the second patterned mask having a second opening such that a second region for the drain is uncovered thereby; and
applying the second ion implantation process to the semiconductor substrate using the second patterned mask as a second implantation mask.

* * * * *